(12) United States Patent
Guo et al.

(10) Patent No.: US 11,601,129 B2
(45) Date of Patent: Mar. 7, 2023

(54) CHARGE PUMP, PHASE-LOCKED LOOP CIRCUIT, AND CLOCK CONTROL APPARATUS

(71) Applicant: HUAWEI TECHNOLOGIES CO., LTD., Guangdong (CN)

(72) Inventors: Na Guo, Shanghai (CN); Qing Min, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/510,110

(22) Filed: Oct. 25, 2021

(65) Prior Publication Data

US 2022/0045684 A1 Feb. 10, 2022

Related U.S. Application Data

(63) Continuation of application No. PCT/CN2019/084404, filed on Apr. 25, 2019.

(51) Int. Cl.
*H03L 7/089* (2006.01)
*H03L 7/093* (2006.01)
*H03L 7/099* (2006.01)

(52) U.S. Cl.
CPC .......... *H03L 7/0895* (2013.01); *H03L 7/093* (2013.01); *H03L 7/099* (2013.01)

(58) Field of Classification Search
CPC .......... H02M 3/073; H02M 3/07; H02M 3/02; H02M 3/04; H02M 3/06; H02M 3/071; H02M 3/072
USPC ................. 327/148, 156, 157, 530, 534–537
See application file for complete search history.

(56) References Cited

U.S. PATENT DOCUMENTS

| 5,663,686 | A | 9/1997 | Tada |
| 5,734,279 | A | 3/1998 | Bereza |
| 6,130,565 | A | 10/2000 | Nagano et al. |
| 6,642,759 | B1 | 11/2003 | Hughes |

(Continued)

FOREIGN PATENT DOCUMENTS

| CN | 101917191 A | 12/2010 |
| CN | 102075182 A | 5/2011 |

(Continued)

OTHER PUBLICATIONS

PCT International Search Report and Written Opinion issued in International Application No. PCT/CN2019/084404 dated Jan. 23, 2020, 14 pages (with English translation).

(Continued)

*Primary Examiner* — Diana J. Cheng
(74) *Attorney, Agent, or Firm* — Fish & Richardson P.C.

(57) ABSTRACT

One example charge pump is provided. The example charge pump includes a degeneration circuit, a charging current source transistor, a switch circuit and a discharging current source transistor. The charging current source transistor provides a charging current. The degeneration circuit is coupled between a first terminal of the charging current source transistor and a power supply terminal. The degeneration circuit degrades a first voltage corresponding to the power supply terminal to a second voltage. The switch circuit is coupled between a second terminal of the charging current source transistor and a load. The switch circuit controls a charging current output to the load.

13 Claims, 15 Drawing Sheets

(56) References Cited

U.S. PATENT DOCUMENTS

| | | | |
|---|---|---|---|
| 7,034,585 B1 * | 4/2006 | Kiani | H03K 17/223 |
| | | | 327/143 |
| 9,634,561 B1 * | 4/2017 | Sinha | H02M 3/07 |
| 10,886,834 B1 * | 1/2021 | Hung | H02M 1/15 |
| 2005/0068090 A1 | 3/2005 | Chen et al. | |
| 2010/0289539 A1 | 11/2010 | Wu | |

FOREIGN PATENT DOCUMENTS

| | | |
|---|---|---|
| CN | 104201880 A | 12/2014 |
| CN | 104734634 A | 6/2015 |
| CN | 105490677 A | 4/2016 |
| CN | 106357266 A | 1/2017 |
| KR | 100415042 B1 | 1/2004 |

OTHER PUBLICATIONS

Extended European Search Report issued in European Application No. 1925718.9 dated Feb. 25, 2022, 8 pages.

Office Action issued in Chinese Application No. 201980091201.8 dated Jun. 22, 2022, 18 pages (with English translation).

\* cited by examiner

CHARGE PUMP, PHASE-LOCKED LOOP CIRCUIT, AND CLOCK CONTROL APPARATUS

CROSS-REFERENCE TO RELATED APPLICATIONS

This application is a continuation of International Application No. PCT/CN2019/084404, filed on Apr. 25, 2019, the disclosure of which is hereby incorporated by reference in its entirety.

TECHNICAL FIELD

This application relates to the field of wireless communications technologies, and in particular, to a charge pump, a phase-locked loop circuit, and a clock control apparatus.

BACKGROUND

With continuous development of wireless communications technologies, a user has increasingly higher requirements on quality and speed of data transmission performed on electronic products. In this case, for a radio frequency circuit that is applied to the foregoing electronic product to implement data transmission, generally a transmitter needs to have a relatively low error vector magnitude (EVM).

The EVM mainly depends on noise of a phase-locked loop (PLL) in the radio frequency circuit and linearity of a transceiver (TRX) in the radio frequency circuit. When linearity of the TRX is good, the noise of the PLL is a main factor that affects the EVM.

SUMMARY

Embodiments of this application provide a charge pump, a phase-locked loop circuit, and a clock control apparatus, to implement a high-speed and low-noise charge pump in the clock control apparatus.

To achieve the foregoing objective, the following technical solutions are applied to the embodiments of this application.

According to an aspect of the embodiments of this application, a charge pump is provided. The charge pump includes a degeneration circuit, a charging current source transistor, a switch circuit and a discharging current source transistor. The charging current source transistor is configured to provide a charging current. The degeneration circuit is coupled between a first terminal of the charging current source transistor and a power supply terminal. The degeneration circuit is configured to degrade a first voltage corresponding to the power supply terminal to a second voltage. The switch circuit is coupled between a second terminal of the charging current source transistor and a load. The switch circuit is configured to control a charging current output to the load. A first terminal of the discharging current source transistor is coupled to the switch circuit and the load. A second terminal of the discharging current source transistor is coupled to the ground, and the discharging current source transistor is configured to provide a charge release channel for a signal output terminal. The degeneration circuit is used to reduce transconductance of the charging current source transistor. The transconductance of the charging current source transistor is positively correlated with flicker noise of the charging current source transistor. Therefore, the degeneration circuit can reduce the flicker noise of the charging current source transistor while reducing the transconductance of the charging current source transistor. In addition, the degeneration circuit is further configured to reduce the first voltage to the second voltage. The second voltage is used as an operating voltage of the switch circuit, the switch circuit, and a discharge circuit. In this application, the degeneration circuit is disposed between the power supply terminal of the charge pump and a charging current source. The degeneration circuit can reduce flicker noise of the charging current source, to reduce noise brought by the charging current source to the charge pump. In addition, the degeneration circuit is configured to reduce the first voltage provided by the power supply terminal to the second voltage, to supply power to the charging current source and the switch circuit. A transistor in the switch circuit uses a thin gate oxygen transistor (whose operating voltage ranges from 0.8 V to 0.9 V, but is not limited to this range), to replace a thick gate oxygen transistor (whose operating voltage ranges from 1.8 V to 2.5 V, but is not limited to this range). Compared with the thick gate oxygen transistor, the thin gate oxygen transistor is a transistor type with an optional small design size, and a smaller threshold voltage and a parasitic capacitance, for example, a low voltage threshold (low voltage threshold, lvt) transistor or an ultra low voltage threshold (ultra low voltage threshold, ulvt) transistor. Therefore, the switch circuit including the thin gate oxygen transistor has a faster switching response speed and a charge-discharge speed, and linearity of the charge pump is greatly improved. In addition, flicker noise of the thin gate oxygen transistor is better than that of the thick gate oxygen transistor. This can effectively reduce noise brought by the switch circuit to the charge pump. In addition, after voltage step-down processing of the degeneration circuit is performed, the thin gate oxygen transistor in the switch circuit operates in a low voltage area after voltage step-down processing. This can avoid a risk of rapid performance degeneration caused because the thin gate oxygen transistor directly operates in a high voltage area, and ensure reliability of a circuit. In conclusion, in this application, a noise reduction function of the degeneration circuit is used, and a voltage step-down function of the degeneration circuit is used. Therefore, the operating voltage of the switch circuit is located in the low voltage area. A transistor that operates at a second voltage in the low voltage area uses a thin gate oxygen transistor, to further obtain a better noise reduction effect.

Optionally, the switch circuit includes a first switching transistor. A gate of the first switching transistor is configured to receive a charging signal. A first terminal of the first switching transistor is coupled to the second terminal of the charging current source transistor, and a second terminal of the first switching transistor is coupled to the load. When the first switching transistor is turned on, a constant current provided by the charging current source transistor can be transmitted to a load, for example, a low-pass filter, coupled to the signal output terminal of the charge pump, to charge the low-pass filter.

Optionally, the first switching transistor uses a thin gate oxygen transistor. A technical effect of a thin gate oxygen transistor design is the same as that described above, and details are not described herein again.

Optionally, the charging current source transistor uses a thin gate oxygen transistor. A technical effect of a thin gate oxygen transistor design is the same as that described above, and details are not described herein again.

Optionally, the degeneration circuit has first impedance, and the first impedance is used to control a voltage value of the second voltage, to drive the charging current source transistor, the switch circuit, and the discharging current source transistor by using the second voltage. In this way, by adjusting impedance of the degeneration circuit, magnitude of the second voltage can be adjusted when the second voltage can drive the charging current source transistor, the switch circuit, and the discharging current source transistor.

Optionally, the degeneration circuit includes at least one resistor.

Alternatively, optionally, the degeneration circuit includes at least one transistor.

Optionally, the transistor uses a thick gate oxygen transistor. Because an operating voltage of the transistor is the first voltage belonging to a high voltage area, to ensure circuit reliability, the foregoing transistor uses a thick gate oxygen transistor design.

Optionally, when both the charging current source transistor and the transistor can use a thick gate oxygen transistor design, gates of a plurality of transistors and a gate of the charging current source transistor receive a same control signal. The charging current source transistor and the plurality of transistors may be simultaneously turned on.

Optionally, when both the charging current source transistor and the transistor can use a thick gate oxygen transistor design, and a manufacturing process can meet a requirement, a size of the transistor is the same as that of the charging current source transistor. This facilitates a circuit layout design. In some other embodiments of this application, the size of the transistor and the size of the charging current source transistor may also be different.

Optionally, gates of a plurality of transistors receive a same control signal. The plurality of transistors may be simultaneously turned on.

Optionally, the switch circuit further includes a second switching transistor and a bypass current transistor. A gate of the second switching transistor is configured to receive a reverse signal of the charging signal. A first terminal of the second switching transistor is coupled to the second terminal of the charging current source transistor. A second terminal of the second switching transistor is coupled to a gate and a first terminal of the bypass current transistor. A second terminal of the bypass current transistor is coupled to the ground. In this case, a signal received by the gate of the second switching transistor is the reverse signal of the charging signal received by the gate of the first switching transistor, and a magnitude of a current passing through the second switching transistor and the bypass current transistor is the same as a magnitude of the charging current provided to the signal output terminal. In this way, a terminal voltage of a terminal connecting the charging current source and the switch circuit can be kept constant, and further, charging can be quickly performed by the charge pump.

Optionally, the charge pump further includes a third switching transistor. A gate of the third switching transistor is configured to receive a discharging signal. A first terminal of the third switching transistor is coupled to the load, and a second terminal of the third switching transistor is coupled to the first terminal of the discharging current source transistor. After the third switching transistor is turned on, a discharging current of the signal output terminal of the charge pump may be transferred to a ground terminal, so that the low-pass filter coupled to the charge pump may be discharged. The third switching transistor uses a thin gate oxygen transistor. A technical effect of a thin gate oxygen transistor design is the same as that described above, and details are not described herein again.

According to another aspect of the embodiments of this application, a phase-locked loop circuit is provided, including a phase frequency detector, a signal processing circuit, and any charge pump described above. The charge pump includes a first switching transistor, and a gate of the first switching transistor is coupled to the signal processor. The signal processing circuit is coupled to the phase frequency detector. The signal processing circuit is configured to reverse an output signal of the phase frequency detector, and output the signal to the gate of the first switching transistor as a charging signal. The phase-locked loop circuit has a same technical effect as the foregoing charge pump, and details are not described herein again.

Optionally, the charge pump further includes a second switching transistor. A gate of the second switching transistor is coupled to the phase frequency detector. The phase frequency detector is configured to output a reverse signal of the charging signal to the gate of the second switching transistor. In this way, a signal that may be received by the gate of the second switching transistor is a reverse signal of a signal received by the gate of the first switching transistor.

Optionally, the charge pump includes a third switching transistor. A gate of the third switching transistor is coupled to the phase frequency detector. The phase frequency detector is configured to output a discharging signal to the gate of the third switching transistor. The phase frequency detector is configured to provide a discharging signal to the gate of the third switching transistor. In this way, the phase frequency detector may control turn-on and turn-off of the third switching transistor.

According to another aspect of the embodiment of this application, a clock control apparatus is provided, including a reference clock generator and any phase-locked loop circuit described above. The reference clock generator is coupled to the phase-locked loop circuit, and the reference clock generator is configured to provide a reference clock signal to the phase-locked loop circuit. The foregoing radio frequency circuit has a same technical effect as the phase-locked loop circuit provided in the foregoing embodiment, and details are not described herein again.

BRIEF DESCRIPTION OF DRAWINGS

FIG. 7b is a schematic diagram of specific structures of some components in FIG. 7a;

FIG. 9b is a schematic diagram of specific structures of some components in FIG. 9a.

REFERENCE NUMERALS

Figure 1:
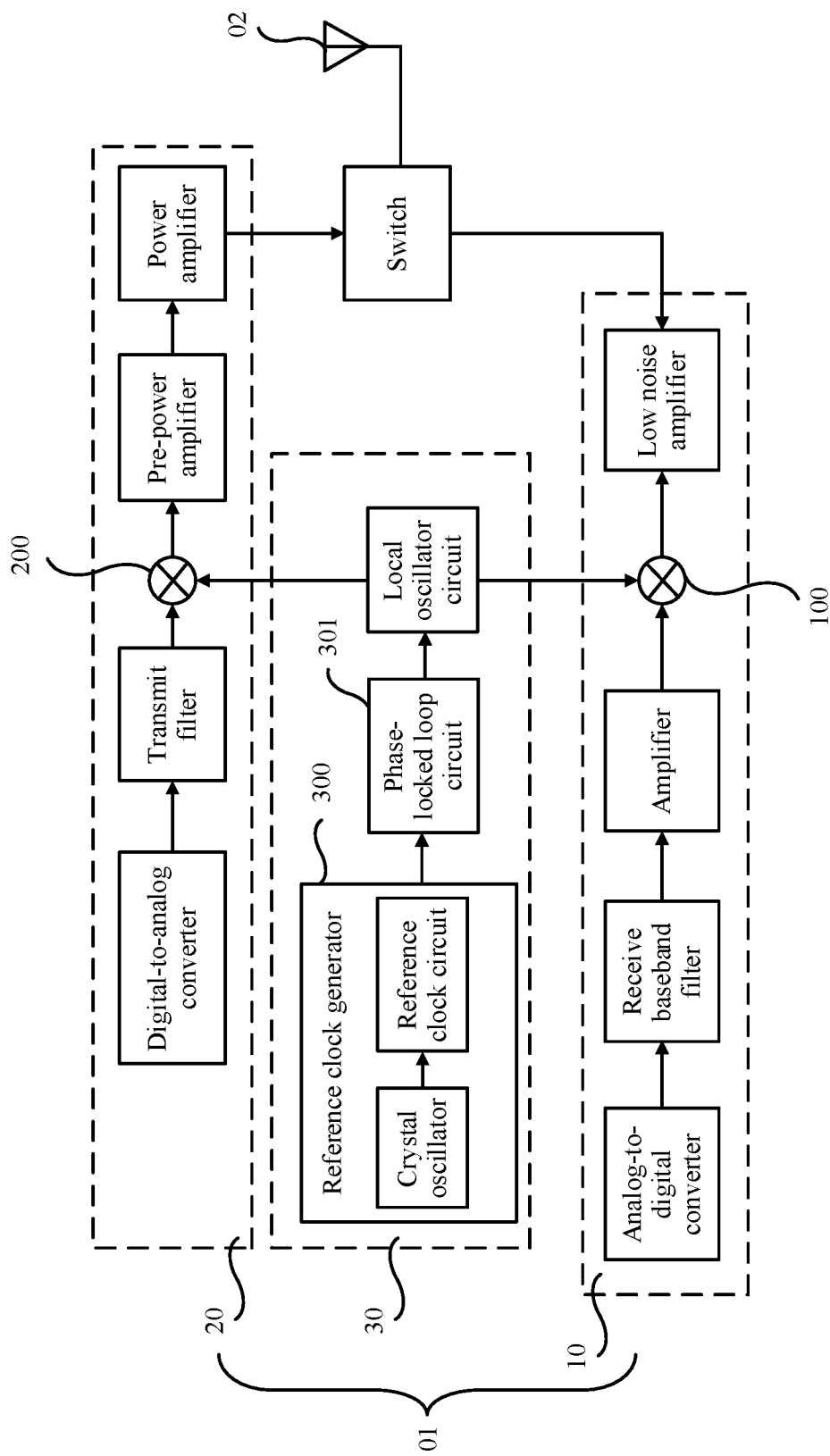
FIG. 1 is a schematic diagram of a structure of a radio frequency circuit according to an embodiment of this application.

01: RF circuit; 02: Antenna; 10: Receive channel; 20: Transmit channel; 30: Local oscillator generation circuit; 100: First frequency mixer; 200: Second frequency mixer; 300: Reference clock generator; 301: Phase-locked loop circuit; 311: Phase frequency detector; 321: Charge pump; 3210: Degeneration circuit; 3211: Switch circuit; 331: Low-pass filter; 341: Voltage controlled oscillator; 351: Signal processing circuit; and 352: Divider.

DESCRIPTION OF EMBODIMENTS

The following describes the technical solutions in the embodiments of this application with reference to the accompanying drawings in the embodiments of this application. It is clear that the described embodiments are merely some but not all of the embodiments of this application.

The terms "first", "second", and the like in this specification are merely intended for a purpose of description, and shall not be understood as an indication or implication of relative importance or implicit indication of a quantity of indicated technical features. Therefore, a feature limited by "first" or "second" may explicitly or implicitly include one or more features. In the descriptions of this application, unless otherwise specified, "a plurality of" means two or more than two.

According to an embodiment of this application, a clock control apparatus is provided. The clock control apparatus may be a chip, a terminal, a radio frequency circuit, or another product related to a clock circuit. For ease of description, the following uses an example in which the clock control apparatus is a radio frequency circuit 01 shown in FIG. 1.

The radio frequency circuit 01 may be applied to some wireless communications devices, for example, a router, a mobile phone, or a tablet computer. The radio frequency circuit 01 is configured to receive and send a wireless signal.

The radio frequency circuit 01 is coupled to an antenna 02. In this case, as shown in FIG. 1, the radio frequency circuit 01 includes a receive channel 10 configured to receive a signal from the antenna 02, and a transmit channel 20 configured to send a signal to the antenna 02.

The receive channel 10 includes a low noise amplifier (low noise amplifier, LNA), a first frequency mixer 100, an amplifier (amplifier, AMP), a receiver (receiver, RX) baseband filter (baseband filter), and an analog to digital converter (analog to digital converter, ADC).

The transmit channel 20 includes a digital to analog converter (digital to analog converter, DAC), a transmit filter (filter), a second frequency mixer 200, a pre-power amplifier (pre-power amplifier, PPA), and a power amplifier (power amplifier, PA).

In addition, as shown in FIG. 1, the radio frequency circuit 01 further includes a local oscillator generation circuit 30. The local oscillator generation circuit 30 is coupled to the first frequency mixer 100 on the receive channel 10 and the second frequency mixer 200 on the transmit channel 20.

The local oscillator generation circuit 30 is configured to provide a local oscillator signal required for demodulation to the receive channel 10. A frequency of the local oscillator signal is mixed with a frequency of a radio frequency carrier signal that is transmitted by the antenna 02 and that is received in the first frequency mixer 100 on the receive channel 10, and is converted into an intermediate frequency signal or a baseband signal, to implement signal demodulation.

The local oscillator generation circuit 30 is further configured to provide a local oscillator signal required for modulation to the transmit channel 20. A frequency of the local oscillator signal is mixed with a frequency of an intermediate frequency signal or a baseband signal that is output by the transmit filter and that is in the second frequency mixer 200 on the transmit channel 20, to change the intermediate frequency signal or the baseband signal to a radio frequency carrier signal that can be sent by using the antenna 02, thereby implementing signal modulation.

As shown in FIG. 1, the local oscillator generation circuit 30 includes a reference clock generator (reference clock generator) 300 configured to generate a reference clock signal. The reference clock generator 300 includes a crystal oscillator (oscillator) and a reference clock circuit coupled to the crystal oscillator.

A phase-locked loop circuit 301 coupled to the reference clock generator 300 is also included.

The phase-locked loop circuit 301 may obtain a phase difference between an input signal and an output signal, and control a frequency and a phase of an internal oscillation signal of the phase-locked loop circuit 301, so that the phase-locked loop circuit 301 outputs a stable signal frequency.

In addition, to enable a modulation signal and a demodulation signal output by the local oscillator generation circuit 30 to meet a product requirement, the local oscillator generation circuit 30 further includes a local oscillator (local oscillator, LO) circuit coupled to the phase-locked loop circuit 301. The local oscillator circuit can perform frequency division and phase processing on a frequency output by the phase-locked loop circuit 301 based on a requirement of a communications system, to finally generate a local oscillator signal as the modulation signal and the demodulation signal.

Figure 2:
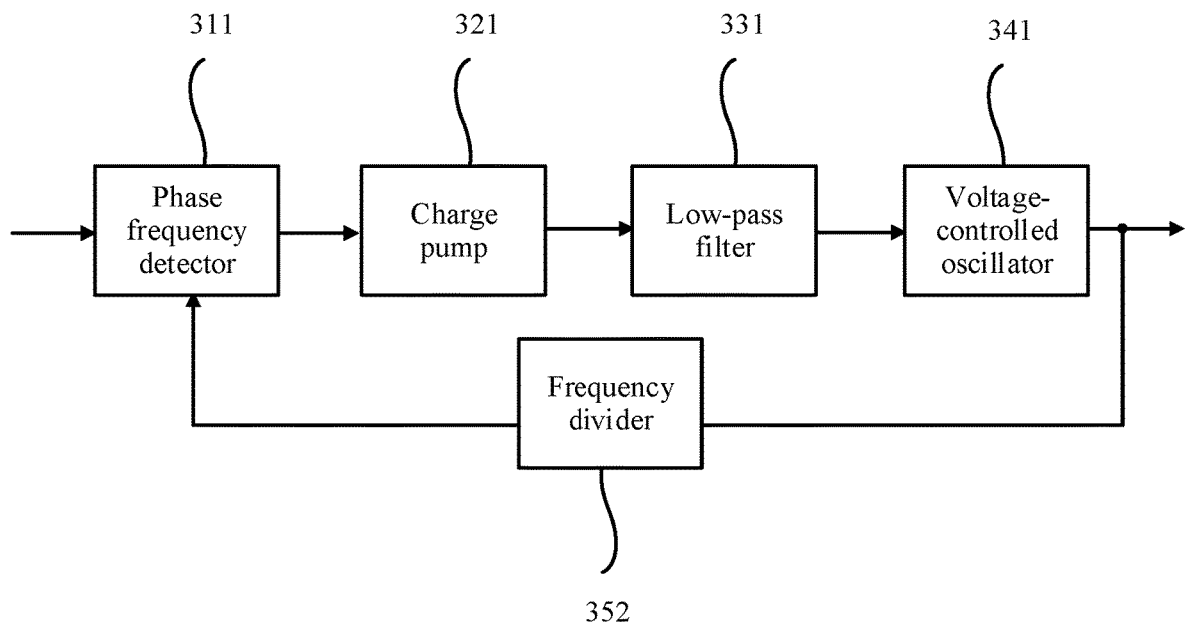
FIG. 2 is a schematic diagram of a structure of a phase-locked loop circuit in the radio frequency circuit shown in FIG. 1.

As shown in FIG. 2, the phase-locked loop circuit 301 includes a phase frequency detector (phase frequency detector, PFD) 311, a charge pump (charge pump, CP) 321, a low pass filter (low pass filter, LF) 331, a voltage controlled oscillator (voltage controlled oscillator, VCO) 341, and a divider (divider) 352.

The phase frequency detector 311 can obtain, based on a reference clock signal provided by the reference clock generator 300, a phase difference between the reference clock signal and a signal output by the frequency divider 352 after frequency division, and provide, based on the phase difference, a pulse control signal to the charge pump 321.

The charge pump 321 generates a current signal matching the phase difference based on the pulse control signal. The current signal can charge and discharge the low-pass filter 331.

The low-pass filter 331 generates, based on the current signal input by the charge pump 321, a control voltage for controlling the voltage controlled oscillator 341.

After receiving the control voltage input by the low-pass filter 331, the voltage controlled oscillator 341 can generate a signal of a corresponding frequency based on the control voltage.

In addition, the frequency divider 352 on a feedback loop performs frequency division processing on the signal output by the voltage controlled oscillator 341, and then a processed signal is transferred to the phase frequency detector 311.

In this case, a frequency of an output signal of the phase-locked loop circuit 301 gradually matches a frequency of the reference clock signal provided by the reference clock generator 300, to stabilize the output signal.

Based on a structure of the phase-locked loop circuit 301, components that contribute relatively much to noise of the phase-locked loop circuit 301 are the charge pump 321 and the voltage controlled oscillator 341. When a high-performance voltage controlled oscillator 341 is designed, an area and power consumption of the phase-locked loop circuit 301 generally need to be increased. However, improving performance of the charge pump 321 can effectively reduce a design requirement on the voltage controlled oscillator 341. This helps reduce the area and the power consumption of the phase-locked loop circuit 301 to some extent.

Based on this, this application provides a high-speed and low-noise charge pump 321.

Figure 3:
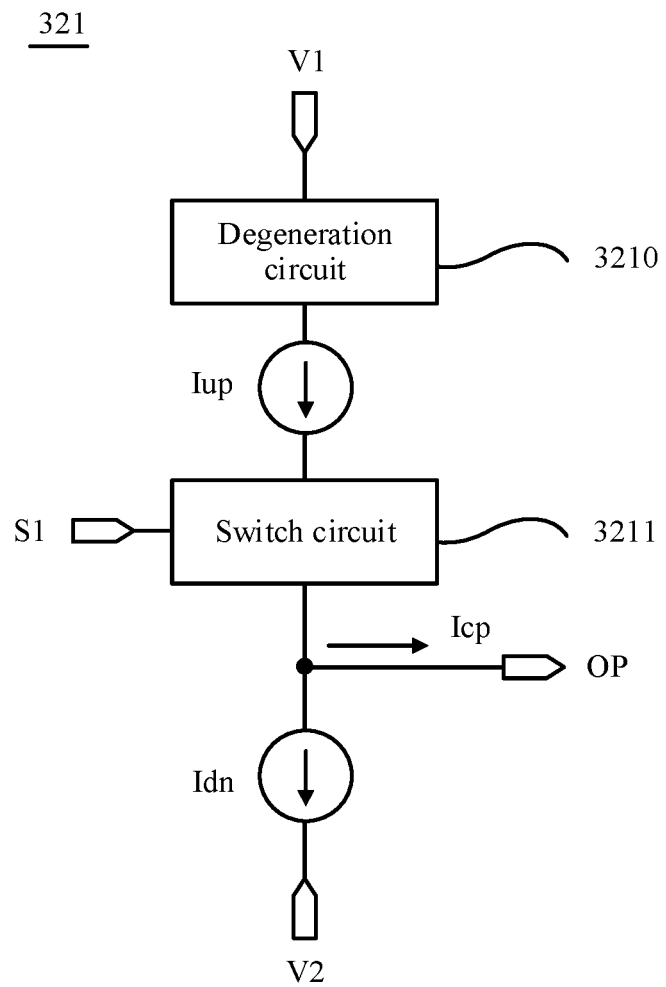
FIG. 3 is a schematic diagram of a structure of a charge pump in the phase-locked loop circuit shown in FIG. 2.
Figure 4A:
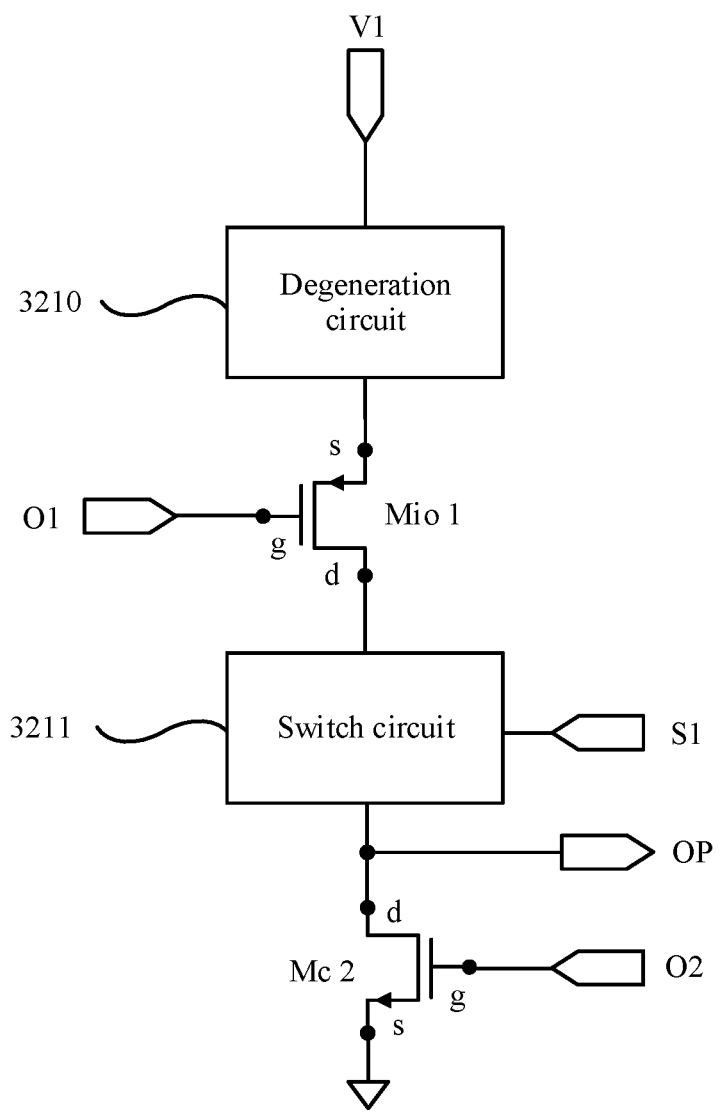
FIG. 4a is a schematic diagram of a structure of a charge pump according to an embodiment of this application.

As shown in FIG. 3, the charge pump 321 includes a degeneration circuit 3210, a charging current source transistor Mio 1 (as shown in FIG. 4a) as a charging current source Iup, a switch circuit 3211, and a discharging current source transistor Mc 2 (as shown in FIG. 4a) as a discharging current source Idn.

It should be noted that, in some embodiments of this application, the charging current source transistor Mio 1 may be a P-type metal oxide semiconductor transistor, namely, a PMOS transistor. In this case, a first terminal of the transistor is a source (S) and a second terminal is a drain (D).

The discharging current source transistor Mc 2 is an NMOS transistor. In this case, a first terminal of the transistor is a drain d, and a second terminal is a source s.

The charging current source transistor Mio 1 is configured to provide a charging current.

As shown in FIG. 4a, the degeneration circuit 3210 is coupled between a first terminal, for example, the source s, of the charging current source transistor Mio 1 and a power supply terminal V1. The degeneration circuit 3210 is configured to degrade a first voltage VDD 1 corresponding to the power supply terminal V1 to a second voltage VDD 2.

The second voltage VDD 2 serves as an operating voltage of the charging current source transistor Mio 1, the switch circuit 3211, and the discharging current source transistor Mc 2.

In this case, the second voltage VDD 2 is less than the first voltage VDD 1. A voltage of the first terminal, that is, the source s, of the charging current source transistor Mio 1, is reduced under a degeneration effect of the degeneration circuit 3210. Therefore, the degeneration circuit 3210 may exert a source degeneration (source degeneration) effect on the charging current source transistor Mio 1.

In addition, the degeneration circuit 3210 may reduce transconductance (Transconductance) of the charging current source transistor Mio 1. The transconductance of the charging current source transistor Mio 1 is positively related to flicker noise (flicker noise, fn) of the charging current source transistor Mio 1. Therefore, in a process of reducing the transconductance of the charging current source transistor Mio 1, the degeneration circuit 3210 may reduce the fn of the charging current source transistor Mio 1.

As shown in FIG. 4a, the switch circuit 3211 is coupled between a second terminal, for example, the drain d, of the charging current source transistor Mio 1 and a load. The switch circuit 3211 is configured to control a charging current output to the load.

It should be noted that the load may be the low-pass filter 331 shown in FIG. 2. In some embodiments of this application, when the charge pump 321 has a signal output terminal OP, the signal output terminal OP of the charge pump 321 may be coupled to the low-pass filter 331.

Figure 5:
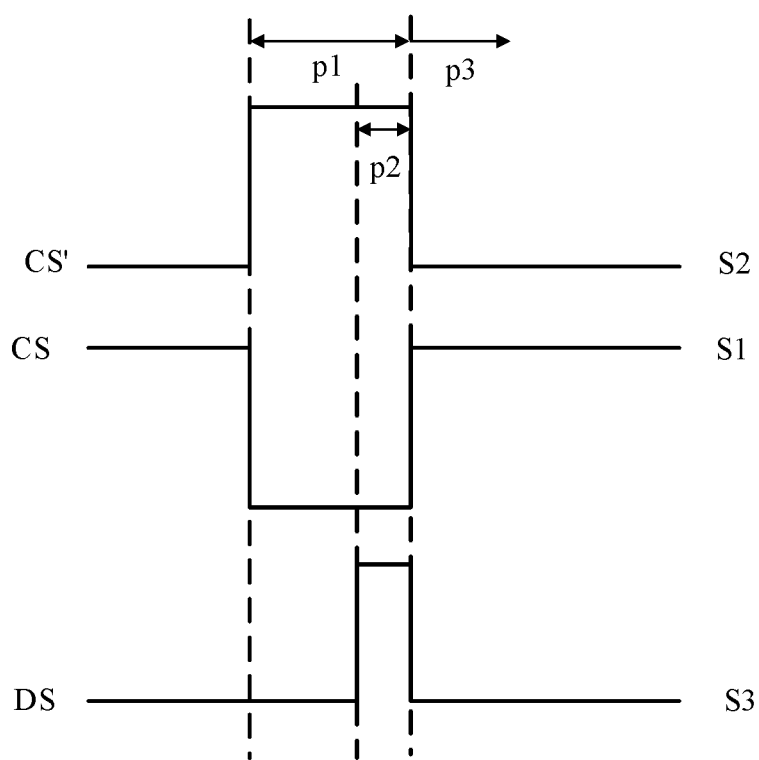
FIG. 5 is a diagram of a signal waveform according to an embodiment of this application.

In addition, in some embodiments of this application, when the charge pump 321 has a first signal control terminal S1, the switch circuit 3211 may be controlled by a charging signal CS (as shown in FIG. 5) output by the first signal control terminal S1, and the charging current provided by the charging current source transistor Mio 1 is transmitted to the signal output terminal OP by using the switch circuit 3211, and is finally output to the low-pass filter 331 serving as the load. In this way, the low-pass filter 331 is charged.

It can be learned from the foregoing that the second voltage VDD 2 received by the switch circuit 3211 is less than the first voltage VDD 1. In some embodiments of this application, for example, the first voltage VDD 1 provided by the power supply terminal V1 of the charge pump 321 may be 1.8 V, and the second voltage VDD 2 obtained under a degeneration effect of the degeneration circuit 3210 may be 0.9 V.

Further, as shown in FIG. 4a, a first terminal, for example, the drain d, of the discharging current source transistor Mc 2 is coupled to both the switch circuit 3211 and the load. A second terminal of the discharging current source transistor Mc 2 is coupled to the ground.

In some embodiments of this application, a gate of the discharging current source transistor Mc 2 is coupled to a second bias voltage terminal 02 of the charge pump 321. The second bias voltage terminal 02 is configured to: when the charge pump 321 is in an operating state, provide a constant second bias voltage to the gate of the discharging current source transistor Mc 2, to ensure that the discharging current source transistor Mc 2 has a constant conduction current.

The discharging current source transistor Mc 2 is configured to provide a charge release channel for a load coupled to the signal output terminal OP, so that a charge of the signal output terminal OP may be released to a ground terminal by using the discharging current source transistor Mc 2, to discharge the low-pass filter 331 coupled to the signal output terminal OP.

It should be noted that the ground terminal may be a reference ground or a power ground. This is not limited in this application.

In conclusion, the degeneration circuit 3210 can reduce fn noise of the charging current source transistor Mio 1, so that noise brought by the charging current source transistor Mio 1 to the charge pump 321 can be reduced.

In addition, the degeneration circuit 3210 has first impedance. The first impedance may be used to control a voltage value of the second voltage VDD 2, so that the second voltage VDD 2 can drive the charging current source transistor Mio 1, the switch circuit 3211, and the discharging current source transistor Mc 2.

When the second voltage VDD 2 is used as the switch circuit 3211, a transistor in the switch circuit 3211 uses a thin gate oxygen transistor (whose operating voltage ranges from 0.8 V to 0.9 V, but is not limited to this range), to replace a thick gate oxygen transistor (whose operating voltage ranges from 1.8 V to 2.5 V, but is not limited to this range).

Compared with the thick gate oxygen transistor, the thin gate oxygen transistor is a transistor type with an optional small design size and a smaller threshold voltage, for example, an lvt transistor, or a ulvt transistor. Therefore, the switch circuit 3211 including the thin gate oxygen transistor has a faster switching response speed and a charge-discharge speed, and linearity of the charge pump 321 is greatly improved. In addition, fn noise of the thin gate oxygen transistor is better than that of the thick gate oxygen transistor. This can effectively reduce noise brought by the switch circuit 3211 to the charge pump. In addition, the thin gate oxygen transistor in the switch circuit 3211 operates at the second voltage VDD 2 in a low voltage area. This can avoid a risk of rapid performance deterioration caused because the thin gate oxygen transistor directly operates in a high voltage area, and reliability of the circuit can be ensured.

It should be noted that, for ease of description, in this application, "Mc" is used to represent a thin gate oxygen transistor, and "Mio" is used to represent a thick gate oxygen transistor.

The following describes in detail specific structures of the degeneration circuit 3210 and the switch circuit 3211.

Example 1

In this example, the degeneration circuit 3210 includes at least one resistor. When the degeneration circuit 3210 includes a plurality of resistors, the plurality of resistors may be connected in series, or may be connected in parallel.

Figure 4B:
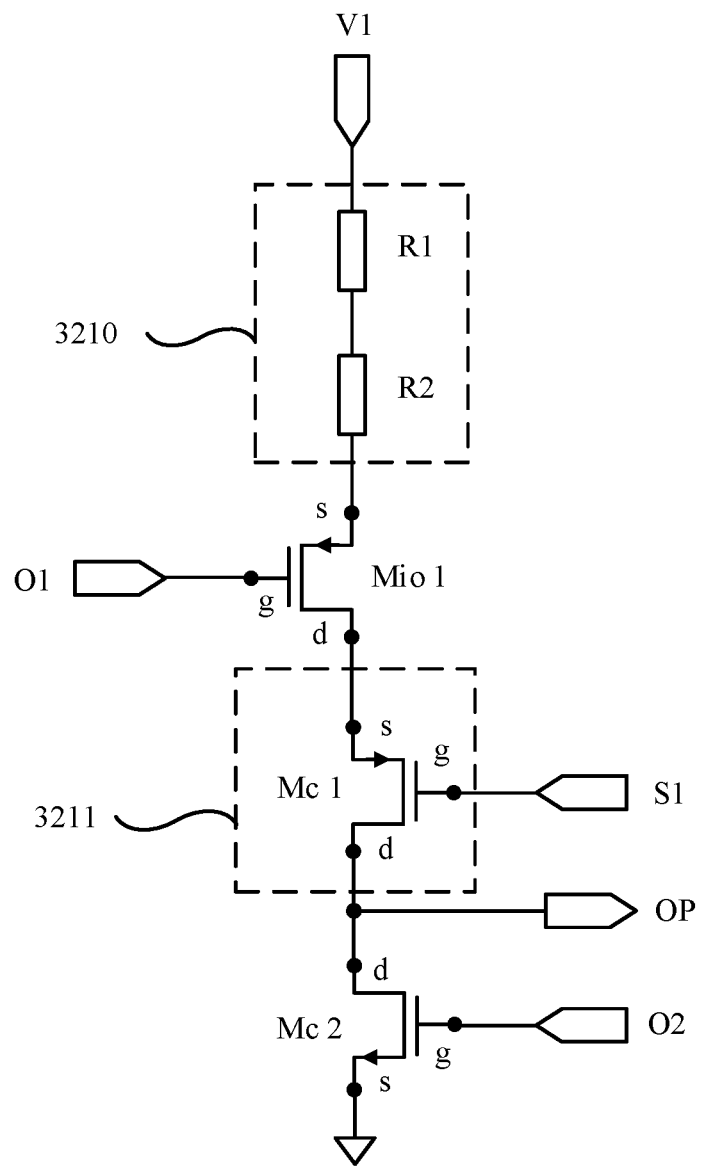
FIG. 4b is a schematic diagram of a specific structure of a charge pump according to an embodiment of this application.

For example, FIG. 4b is described by using an example in which the degeneration circuit 3210 includes a resistor R1 and a resistor R2 that are connected in series between the power supply terminal V1 of the charge pump 321 and the charging current source transistor Mio 1.

In some embodiments of this application, a gate (gate, g for short) of the charging current source transistor Mio 1 is coupled to a first bias voltage terminal O1 of the charge pump 321. The first bias voltage terminal O1 is configured to: when the charge pump 321 is in an operating state, provide a constant first bias voltage to the gate of the charging current source transistor Mio 1, to ensure that the charging current source transistor Mio 1 has a constant current.

When the degeneration circuit 3210 includes a plurality of resistors connected in series, a first terminal, for example, the source s, of the charging current source transistor Mio 1 is coupled to one terminal of a resistor closest to the charging current source transistor Mio 1, for example, the resistor R2.

In addition, as shown in FIG. 4b, the switch circuit 3211 includes a first switching transistor Mc 1.

It should be noted that, in some embodiments of this application, the first switching transistor Mc 1 may be a P-type transistor, that is, a PMOS transistor. In this case, a first terminal of the first switching transistor Mc 1 is a source s, and a second terminal is a drain d.

A gate g of the first switching transistor Mc 1 may be coupled to the first signal control terminal S1 of the charge pump 321. The gate g of the first switching transistor Mc 1 may be configured to receive a charging signal CS (as shown in FIG. 5) by using the first signal control terminal S1 of the charge pump 321.

A first terminal, for example, the source s, of the first switching transistor Mc 1 is coupled to the second terminal, for example, the drain d, of the charging current source transistor Mio 1 and a second terminal, for example, the drain d, of the first switching transistor Mc 1 may be coupled to the load by using the signal output terminal OP.

Figure 6:
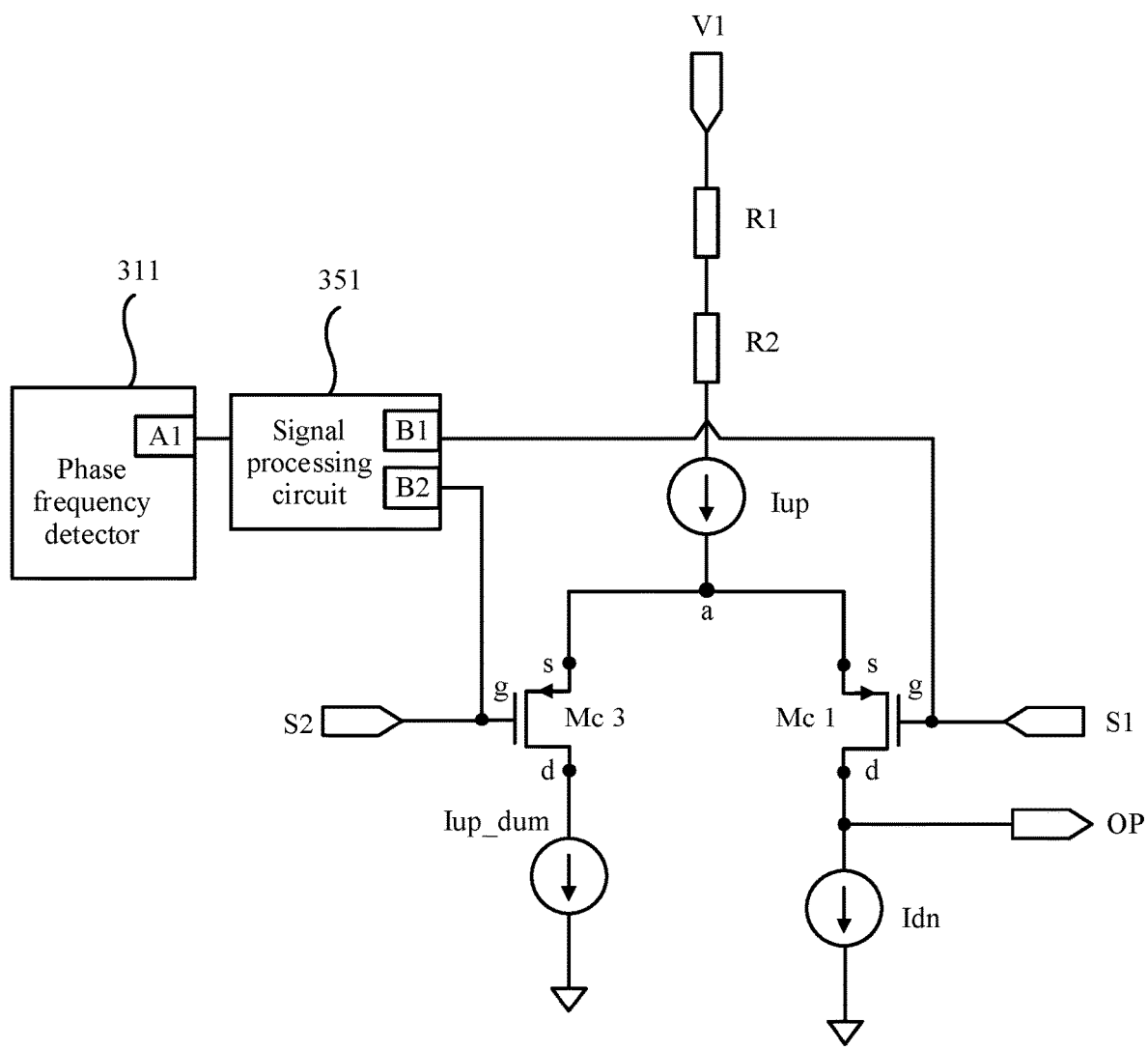
FIG. 6 is a schematic diagram of a structure of coupling between a phase frequency detector and a charge pump according to an embodiment of this application.

In some embodiments of this application, the phase-locked loop circuit 301 further includes a phase frequency detector 311 and a signal processing circuit 351 shown in FIG. 6.

An input terminal of the signal processing circuit 351 is coupled to a first signal output terminal A1 of the phase frequency detector 311. A first output terminal B1 of the signal processing circuit 351 is coupled to the first signal control terminal S1 of the charge pump 321, that is, coupled to the gate g of the first switching transistor Mc 1 in the switch circuit 3211 of the charge pump 321.

The first output terminal B1 of the signal processing circuit 351 is configured to output a reverse signal of the first signal output terminal A1 of the phase frequency detector 311.

In this case, the signal output by the first signal output terminal A1 of the phase frequency detector 311 passes through the signal processing circuit 351, and is provided to the first signal control terminal S1 as the charging signal CS shown in FIG. 5. In this way, after a signal at the first signal output terminal A1 of the phase frequency detector 311 passes through the signal processing circuit 351, the signal can control the first switching transistor Mc 1 to operate normally.

It can be learned from the foregoing that the switch circuit 3211 operates at the second voltage VDD 2, and in a voltage area in which the second voltage VDD 2 is located, the first switching transistor Mc 1 in the switch circuit 3211 uses a thin gate oxygen transistor. A technical effect of a thin gate oxygen transistor design is the same as that described above, and details are not described herein again.

In addition, in some embodiments of this application, the charging current source transistor Mio 1 may use a thick gate oxygen transistor, or in some other embodiments of this application, the charging current source transistor Mio 1 may use a thin gate oxygen transistor design. This is not limited in this application.

In this case, when the gate of the first switching transistor Mc 1 shown in FIG. 4b receives a valid charging signal CS (as shown in FIG. 5, the CS is at a low level in a p1 phase), the first switching transistor Mc 1 is turned on.

In addition, under control of the first bias voltage terminal O1, a current provided by the charging current source transistor Mio 1 passes through the first switching transistor Mc 1, and is transmitted to the signal output terminal OP of the charge pump 321. In this way, the low-pass filter 331 coupled to the signal output OP of the charge pump 321 is charged.

The signal output terminal OP of the charge pump 321 further continuously discharges to the ground terminal by using the discharging current source transistor Mc 2 as the discharging current source Idn. In this way, the signal output terminal OP is continuously discharged by using the discharging current source transistor Mc 2, so that a voltage value output by the signal output terminal OP is periodically constant in a locked state.

Figure 4C:
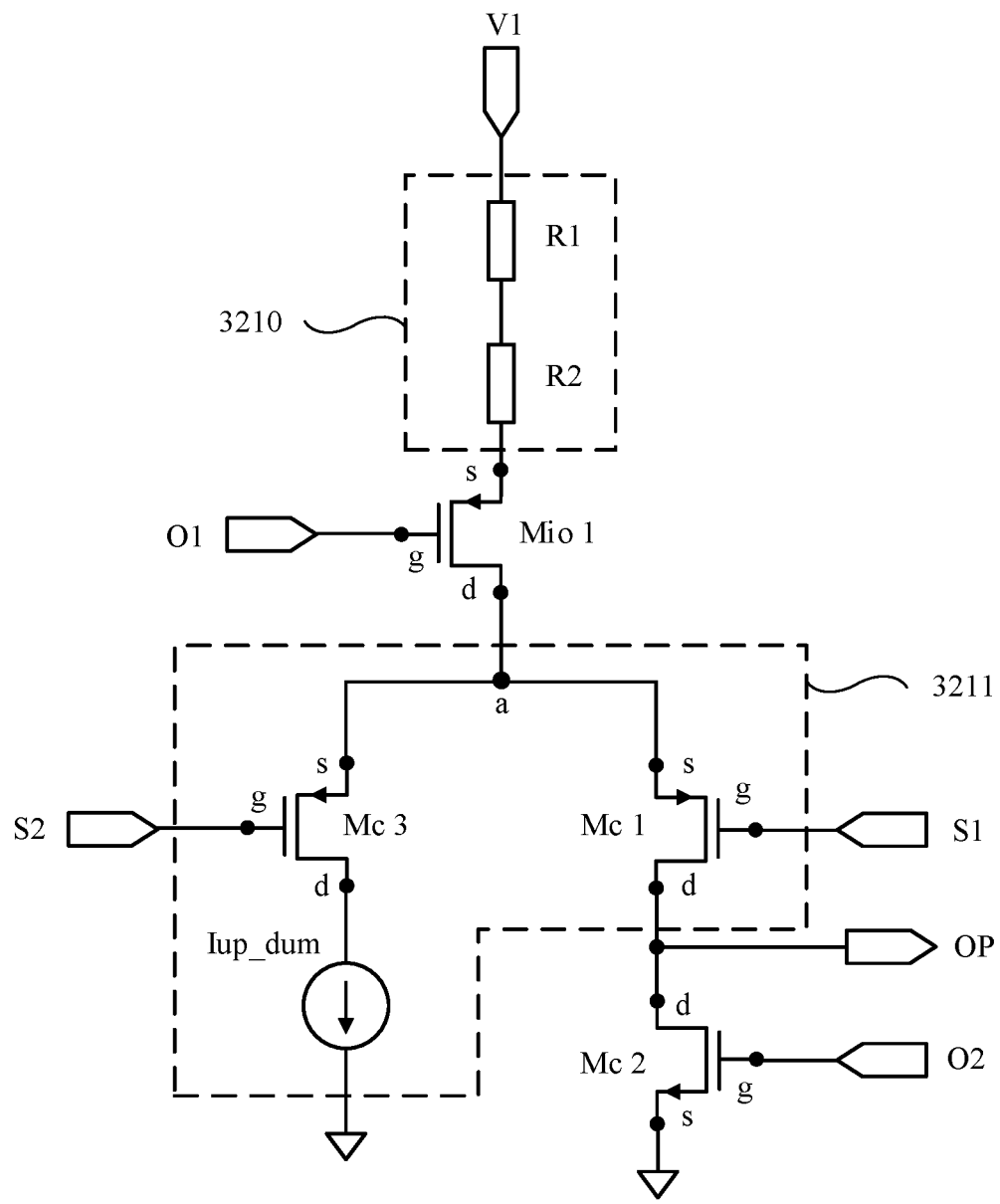
FIG. 4c is a schematic diagram of a specific structure of another charge pump according to an embodiment of this application.
Figure 4D:
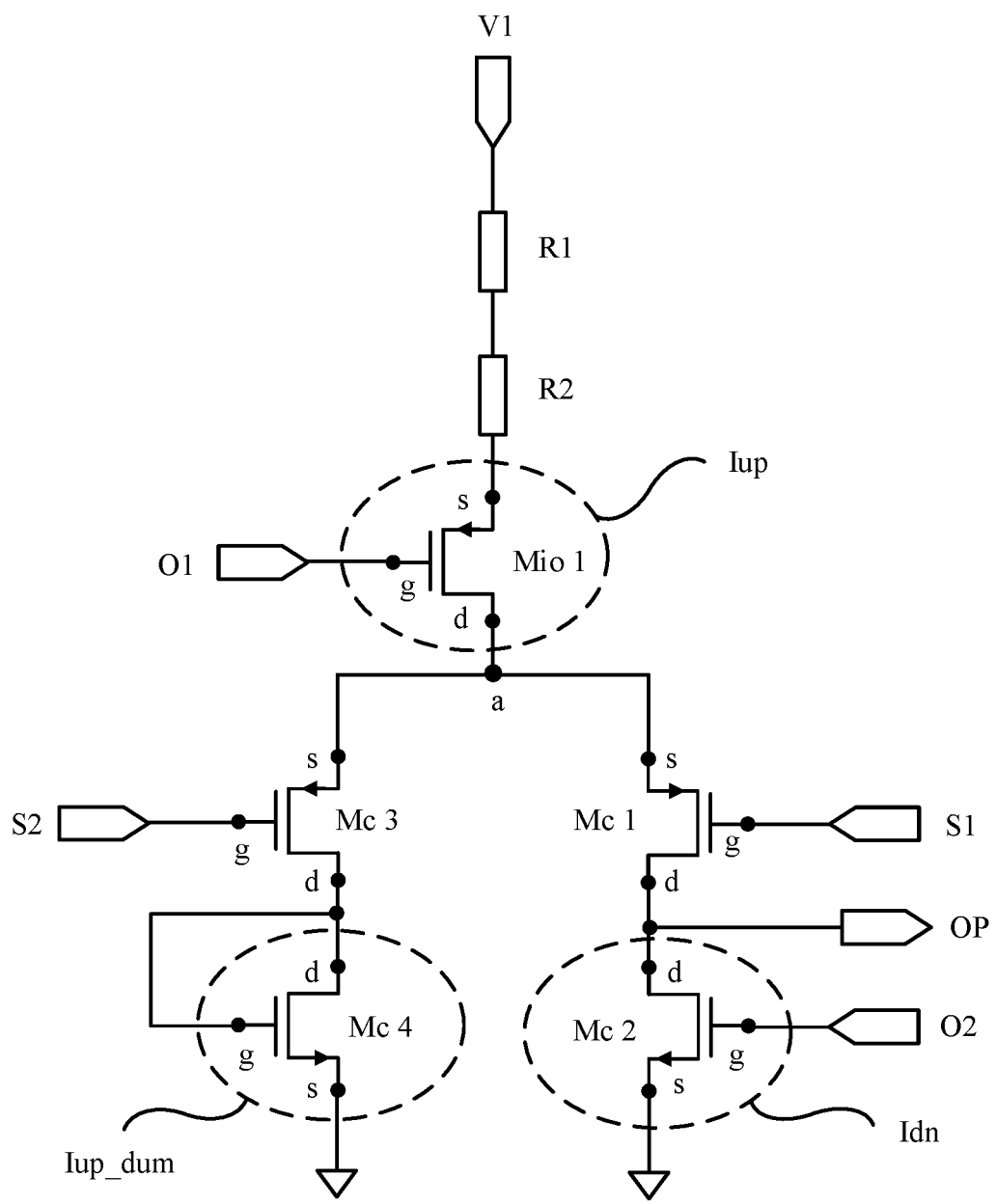
FIG. 4d is a schematic diagram of a specific structure of still another charge pump according to an embodiment of this application.

In addition, as shown in FIG. 4c, the switch circuit 3211 is further coupled to a second signal control terminal S2 of the charge pump. The switch circuit 3211 further includes a second switching transistor Mc 3 and a bypass current transistor Mc 4 shown in FIG. 4d as a bypass current source Iup_dum.

The bypass current transistor Mc 4 is an NMOS transistor, and the second switching transistor Mc 3 is a PMOS transistor. Both the bypass current transistor Mc 4 and the second switching transistor Mc 3 may be thin gate oxygen transistors. A technical effect of a thin gate oxygen transistor design is the same as that described above, and details are not described herein again.

As shown in FIG. 4*a*, a gate of the second switching transistor Mc 3 is coupled to the second signal control terminal S2 of the charge pump 321, and a reverse signal CS' (as shown in FIG. 5) of the charging signal CS may be received by using the second signal control terminal S2.

A first terminal, for example, a source s, of the second switching transistor Mc 3 is coupled to the second terminal, for example, the drain d, of the charging current source transistor Mio 1. A second terminal, for example, a drain d, of the second switching transistor Mc 3 is coupled to a gate and a first terminal, for example, a drain d, of the bypass current transistor Mc 4.

A second terminal, for example, a source s, of the bypass current transistor Mc 4 is coupled to the ground. The bypass current transistor Mc 4 is turned on by self-biasing.

Based on this, in some embodiments of this application, as shown in FIG. 6, the phase-locked loop circuit 301 includes the signal processing circuit 351 and the phase frequency detector 311. The input terminal of the signal processing circuit 351 is coupled to the first signal output terminal A1 of the phase frequency detector 311, and the first output terminal B1 of the signal processing circuit 351 is coupled to the first signal control terminal S1 of the charge pump 321.

A gate of the second switching transistor Mc 3 is coupled to the second signal control terminal S2 of the charge pump 321. The second signal control terminal S2 of the charge pump 321 is coupled to the second output terminal B2 of the signal processing circuit 351. The second output terminal B2 of the signal processing circuit 351 is configured to output a signal same as that output by the first signal output terminal A1 of the phase frequency detector 311. In this case, a signal received by the second signal control terminal S2 is the reverse signal CS' of the charging signal CS received by the first signal control terminal S1 of the charge pump 321, as shown in FIG. 5.

In this case, for example, in FIG. 5, when the first signal control terminal S1 of the charge pump 321 receives the charging signal CS, and when the CS is at a low level in the p1 phase, the first switching transistor Mc 1 is turned on.

In addition, a signal received by the gate of the second switching transistor Mc 3 is the reverse signal CS' of the charging signal CS, and the second switching transistor Mc 3 is turned off.

Alternatively, for example, as shown in FIG. 5, when the first signal control terminal S1 of the charge pump 321 receives the charging signal CS, and the charging signal is at a high level in a p3 phase, the first switching transistor Mc 1 is turned off.

In addition, a signal received by the gate of the second switching transistor Mc 3 is the reverse signal CS' of the charging signal CS, and the second switching transistor Mc 3 is turned on.

In conclusion, a signal received by the gate of the second switching transistor Mc 3 is the reverse signal CS' of the charging signal CS received by the gate of the first switching transistor Mc 1. In addition, a magnitude of a current passing through the second switching transistor Mc 3 and the bypass current transistor Mc 4 is the same as a magnitude of a charging current Icp supplied to the signal output terminal OP. In this way, a voltage of a node a in FIG. 6 is kept constant, so that a switching response speed of the first switching transistor Mc 1 is faster.

It can be learned from the foregoing that the degeneration circuit 3210 is disposed in the charge pump 321 to reduce noise of the charge pump 321. In addition, the degeneration circuit 3210 may further reduce the first voltage VDD 1 corresponding to the power supply terminal V1 of the charge pump 321 to the second voltage VDD 2. In this way, the transistors, for example, the first switching transistor Mc 1, the second switching transistor Mc 3, a Mc 2 of a bias current transistor, and the bypass current transistor Mc 4 all use a thin gate oxygen transistor design.

In this case, a gate oxide layer of the thin gate oxide transistor is relatively thin, and rapid performance degeneration is likely to occur if the thin gate oxide transistor directly operates in a high voltage area. However, under a voltage step-down effect of the degeneration circuit 3210, the thin gate oxygen transistors can operate at a safety voltage, the second voltage VDD 2. This can avoid a reliability risk existing when a thin gate oxygen transistor having a relatively weak voltage withstanding capability operates in a high voltage area, for example, the thin gate oxygen transistor operates at the first voltage VDD 1.

In addition, compared with a thick gate oxygen transistor, when a thin gate oxygen transistor having a lower threshold voltage Vth is used, the thin gate oxygen transistor may have a smaller size and a smaller parasitic capacitance. In this way, when the second voltage VDD 2 is used as an operating voltage, the thin gate oxygen transistor has a fast switching response speed and a charge-discharge speed, and helps to improve linearity of the charge pump 321. In addition, the fn noise of the thin gate oxygen transistor is better than that of the thick gate oxygen transistor. This helps to reduce noise brought by the charge pump 321.

Example 2

Figure 7A:
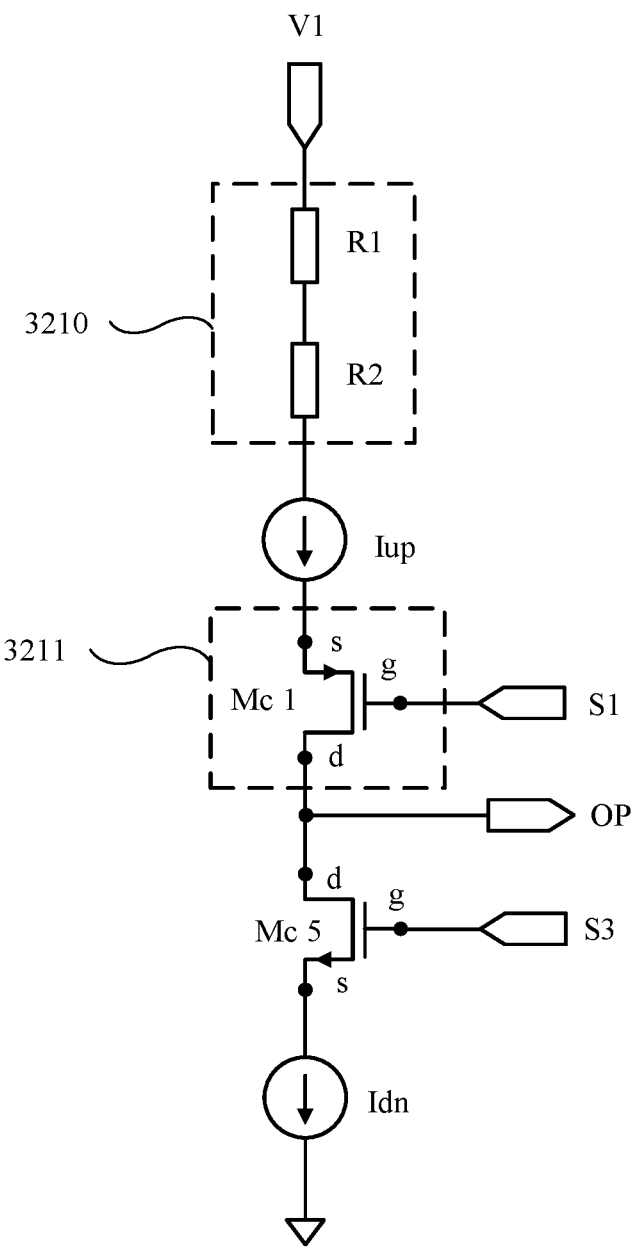
FIG. 7a is a schematic diagram of a structure of a charge pump according to an embodiment of this application.

In this example, a structure of the degeneration circuit 3210 is the same as that of Example 1, for example, a resistor R1 and a resistor R2 shown in FIG. 7*a*.

The switch circuit 3211 includes the first switching transistor Mc 1 and the discharging current source transistor Mc 2 serving as the discharging current source Idn.

A difference from Example 1 lies in that, as shown in FIG. 7*a*, the charge pump 321 further includes a third switching transistor Mc 5.

As shown in FIG. 7*a*, a gate g of the third switching transistor Mc 5 is electrically connected to a third control signal terminal S3 of the charge pump 321, and is configured to receive a discharging signal DS (as shown in FIG. 5) output by the third control signal terminal S3.

Figure 8:
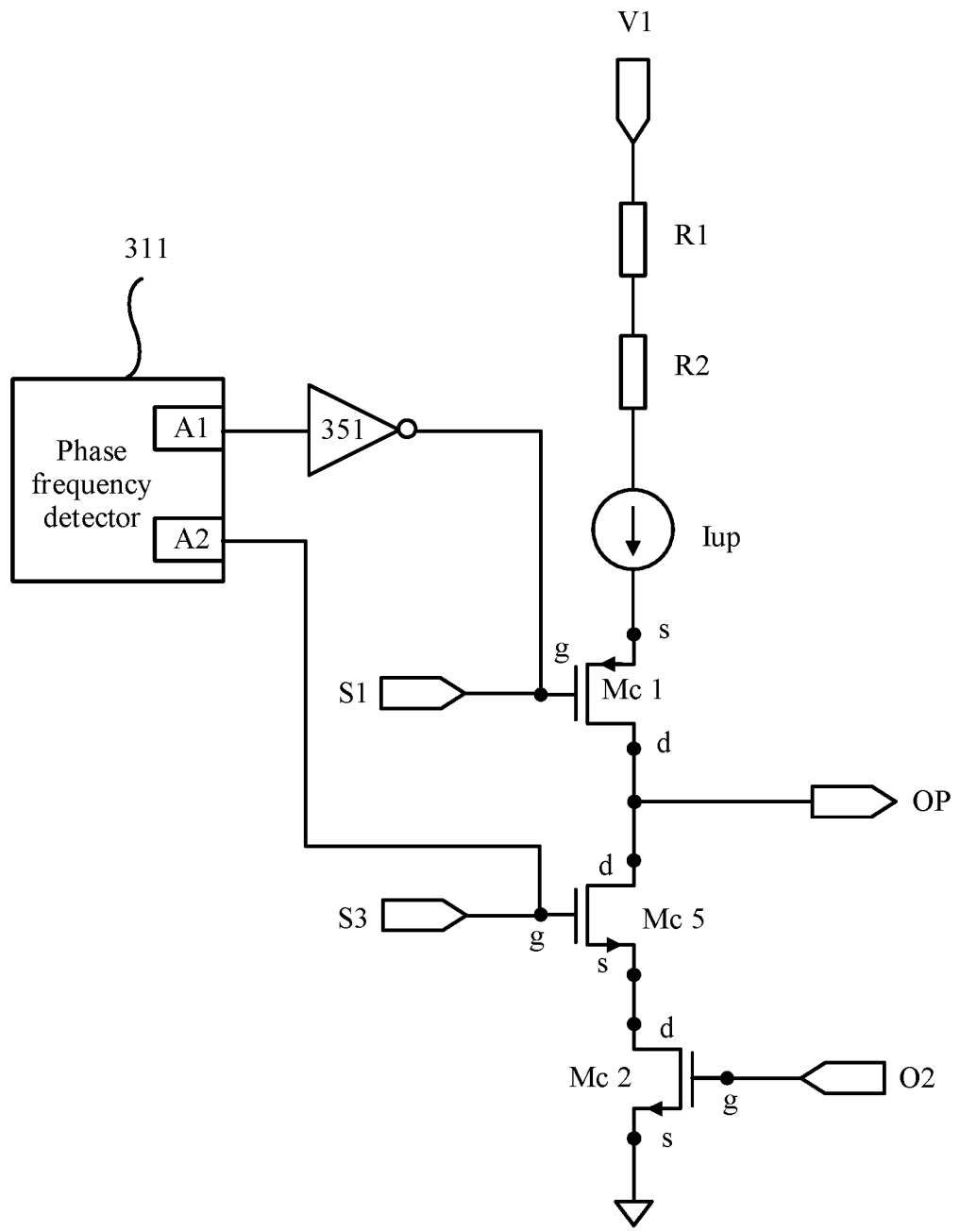
FIG. 8 is a schematic diagram of another structure of coupling between a phase frequency detector and a charge pump according to an embodiment of this application.

For example, as shown in FIG. 8, the phase frequency detector 311 has a second signal output terminal A2. The phase frequency detector 311 outputs the discharging signal DS (as shown in FIG. 5) by using the second signal output terminal A2. In this case, the third control signal terminal S3 of the charge pump 321 is coupled to the second signal output terminal A2 of the phase frequency detector 311.

In addition, a first terminal, for example, a drain d, of the third switching transistor Mc 5 may be coupled to a load by using the signal output terminal OP.

Figure 7B:
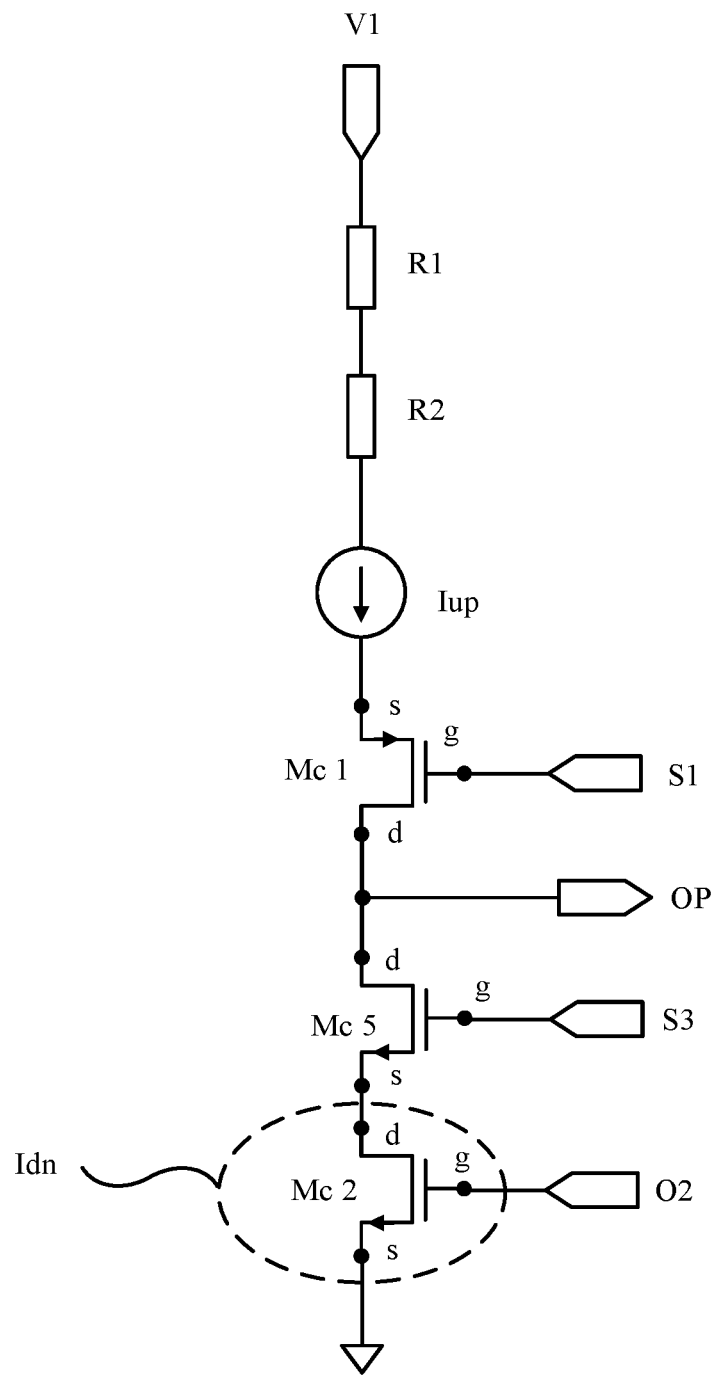

As shown in FIG. 7*b*, a second terminal, for example, a source s, of the third switching transistor Mc 5 is coupled to the first terminal, for example, the drain d, of the discharging current source transistor Mc 2.

It should be noted that in this embodiment of this application, the third switching transistor Mc 5 is the foregoing NMOS.

In this case, an operating process of the charge pump 321 is as follows: After a signal output by the first signal output terminal A1 of the phase frequency detector 311 passes through the signal processing circuit 351, the charging signal CS is supplied to the first signal control terminal S1 of the charge pump 321 by using the first signal output terminal B1 of the signal processing circuit 351. For example, as shown in FIG. 5, when the charging signal is at a low level in the p1 phase, the charging signal CS is transmitted to the gate of the first switching transistor Mc 1 by using the first signal control terminal S1, and the first switching transistor Mc 1 is turned on.

In this case, after passing through the first switching transistor Mc 1, a constant current provided by the charging current source Iup is transmitted to the signal output terminal OP of the charge pump 321, to charge the low-pass filter 331 coupled to the signal output terminal OP of the charge pump 321.

For example, as shown in FIG. 5, the second signal output terminal A2 of the phase frequency detector 311 outputs the valid discharging signal DS, and when the discharging signal is at a high level in a p2 phase, the discharging signal DS is transmitted to the gate of the third switching transistor Mc 5 by using the third control signal terminal S3, the third switching transistor Mc 5 is turned on, and the signal output terminal OP discharges to the ground terminal by using the discharging current source transistor Mc 2. In this way, the low-pass filter 331 is discharged.

In addition, when a stable phase difference t is formed between a reference clock signal obtained by the phase frequency detector 311 and a feedback signal, and after signals output by the first signal output terminal A1 and the second signal output terminal A2 of the phase frequency detector 311, as shown in FIG. 5, are at a high level in a p3 phase, the first switching transistor Mc 1 and the third switching transistor Mc 5 are turned off. A signal output by the charge pump 321 is in a stable state.

It should be noted that, in Example 1 and Example 2, larger first impedance of the degeneration circuit 3210 indicates a better noise reduction effect of the degeneration circuit 3210. However, because the degeneration circuit 3210 has a voltage step-down function, in a process of setting a resistance value of the degeneration circuit 3210, it further needs to be ensured that the thin gate oxygen transistor in the switch circuit 3211 can operate normally at an operating voltage of the second voltage VDD 2 obtained after voltage step-down of the degeneration circuit 3210.

Example 3

In this example, the degeneration circuit 3210 includes at least one transistor. When the degeneration circuit 3210 includes a plurality of transistors, the plurality of transistors may be connected in series, or may be connected in parallel.

Figure 9A:
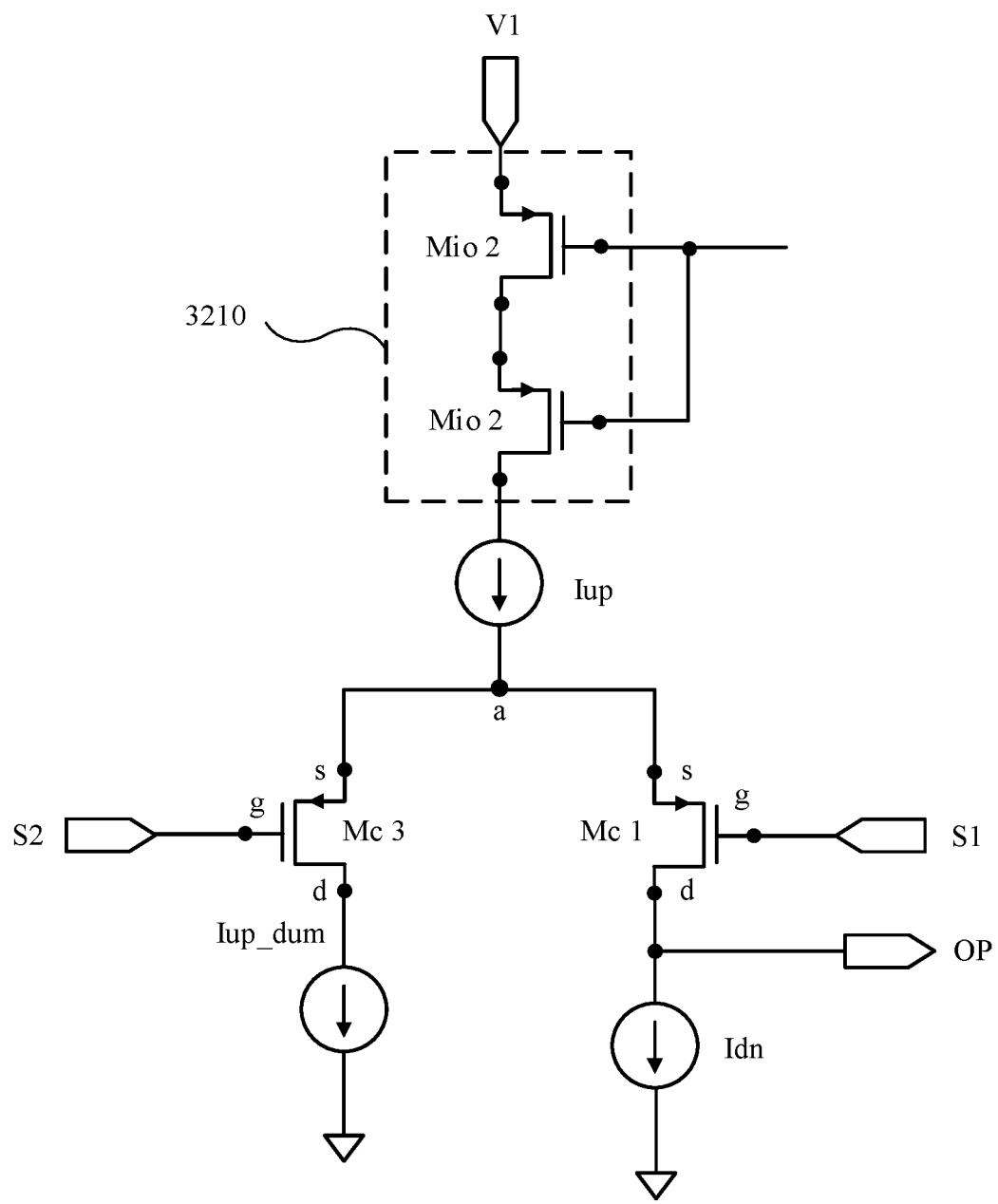
FIG. 9a is a schematic diagram of a structure of a charge pump according to an embodiment of this application.

For example, as shown in FIG. 9a, the degeneration circuit 3210 is described by using an example in which a plurality of transistors Mio 2 that are connected in series between the power supply terminal V1 of the charge pump 321 and the charging current source Iup are included.

Gates of the plurality of transistors Mio 2 may receive a same control signal, so that the plurality of transistors Mio 2 can be simultaneously turned on.

In some embodiments of this application, to enable the gates of the plurality of transistors Mio 2 to receive a same control signal, the gates of the plurality of transistors Mio 2 may be coupled.

In addition, same as in Example 1, the charge pump 321 further includes the first switching transistor Mc 1, the second switching transistor Mc 3, and a discharging current source transistor Mc 2 as the discharging current source Idn.

Because an operating voltage of the transistor Mio 2 is the first voltage VDD 1 belonging to a high voltage area, to ensure circuit reliability, the transistor Mio 2 uses a thick gate oxygen transistor.

In this case, both the charging current source transistor Mio 1 and the transistor Mio 2 may use thick gate oxygen transistors. When a manufacturing process can meet a requirement, a size of the transistor Mio 2 and a size of the charging current source transistor Mio 1 may be the same. This facilitates a circuit layout design.

In some other embodiments of this application, the size of the transistor Mio 2 and the size of the charging current source transistor Mio 1 may be different. This is not limited in this application.

Based on this, when both the charging current source transistor Mio 1 and the transistor Mio 2 use a thick gate oxygen transistor design, the gates of the plurality of transistors Mio 2 and the gate of the charging current source transistor Mio 1 may receive a same control signal. In this way, under control of the first bias voltage terminal O1, the charging current source transistor Mio 1 and the plurality of transistors Mio 2 may be simultaneously turned on, so that the degeneration circuit 3210 and the discharging current source transistor Mc 2 operate simultaneously.

Figure 9B:
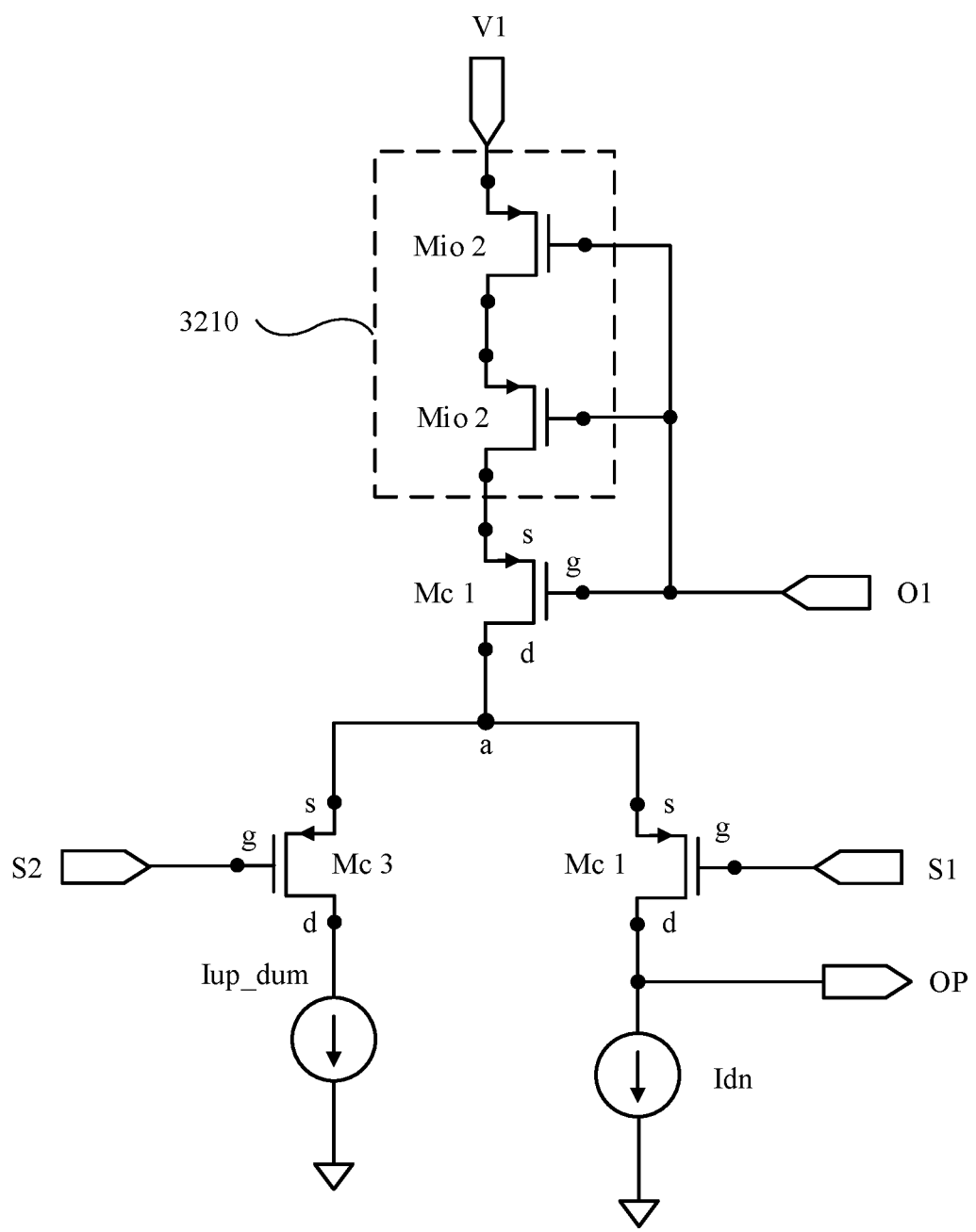

In some embodiments of this application, to enable the gates of the plurality of transistors Mio 2 and the gate of the charging current source transistor Mio 1 to receive a same control signal, as shown in FIG. 9b, the gates of the plurality of transistors Mio 2 and the gate of the charging current source transistor Mio 1 may be coupled.

An operating process of the charge pump 321 in this example is the same as that in Example 1, and details are not described herein again.

Example 4

Figure 10:
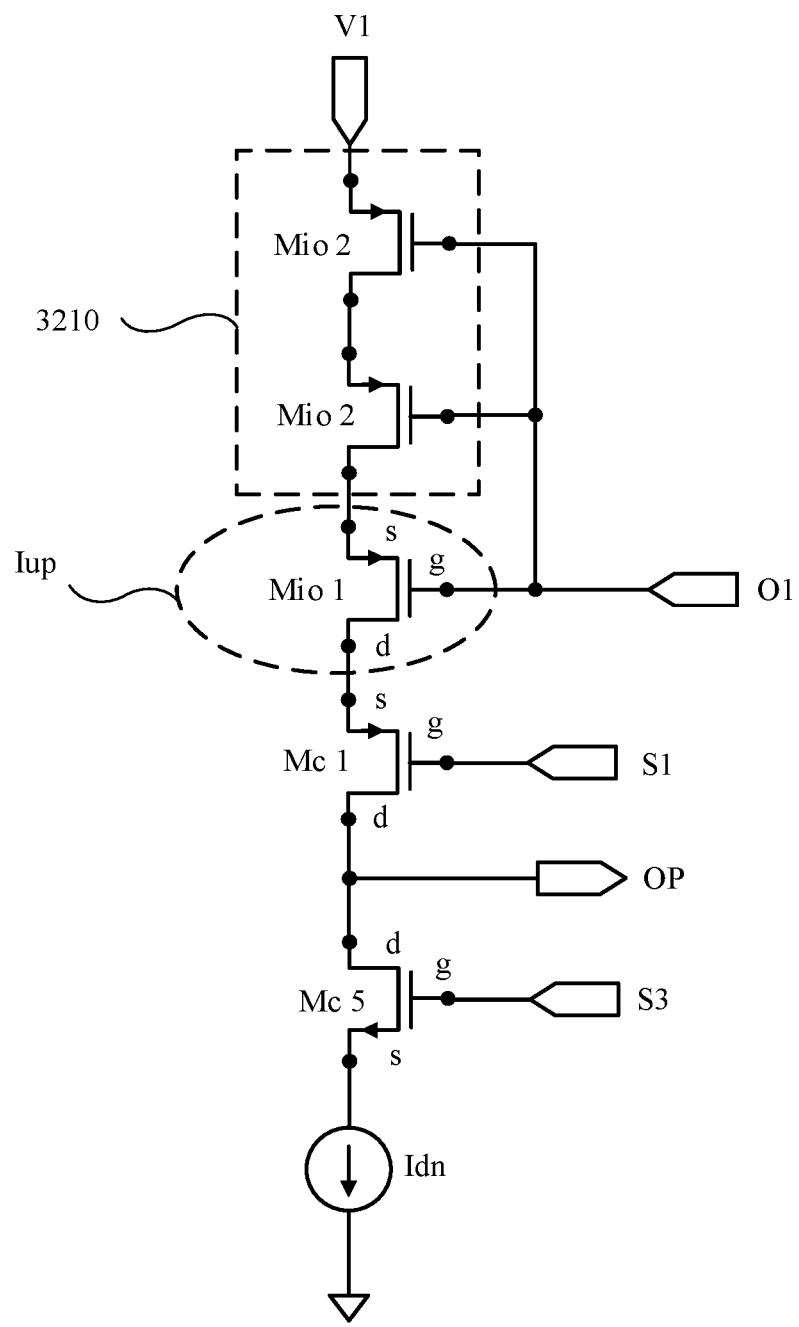
FIG. 10 is a schematic diagram of a structure of a charge pump according to an embodiment of this application.

In this example, as shown in FIG. 10 and same as in Example 3, the degeneration circuit 3210 includes a plurality of transistors Mio 2 that are connected in series.

In addition, same as in Example 2, the switch circuit 3211 includes the first switching transistor Mc 1 and the second switching transistor Mc 3.

The charge pump 321 includes the third switching transistor Mc 5 and the discharging current source transistor Mc 2 as the discharging current source Idn. In this case, an operating principle of the charge pump 321 is the same as that in Example 2, and details are not described herein again.

It should be noted that in Example 3 and Example 4, a quantity of transistors Mio 2 in the degeneration circuit 3210 is not limited. It can be learned from the foregoing that a larger quantity of transistors Mio 2 indicates a better noise reduction effect of the degeneration circuit 3210. However, because the degeneration circuit 3210 has a voltage step-down function, in a process of setting the quantity of transistors Mio 2 in the degeneration circuit 3210, it further needs to be ensured that the thin gate oxygen transistor in the switch circuit 3211 can operate normally at the operating voltage of the second voltage VDD 2 obtained after voltage step-down of the degeneration circuit 3210.

In addition, in some other embodiments of this application, the degeneration circuit 3210 may further include a plurality of resistors connected in series and a plurality of transistors Mio 2 connected in series. One resistor in the plurality of resistors connected in series is coupled to a first terminal or a second terminal of one transistor Mio 2 in the plurality of transistors Mio 2 connected in series. An operating principle of the degeneration circuit 3210 of this structure is the same as that described above, and details are not described herein again.

The foregoing description is merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A charge pump, comprising:
a charging current source transistor that provides a charging current;
a degeneration circuit, coupled between a first terminal of the charging current source transistor and a power supply terminal, wherein the degeneration circuit degrades a first voltage corresponding to the power supply terminal to a second voltage;
a switch circuit, coupled between a second terminal of the charging current source transistor and a load, wherein the switch circuit controls the charging current output to the load; and
a discharging current source transistor, wherein a first terminal of the discharging current source transistor is coupled to the load, and the first terminal of the discharging current source transistor is coupled directly to the switch circuit, and a second terminal of the discharging current source transistor is coupled to ground.

2. The charge pump according to claim 1, wherein the switch circuit comprises a first switching transistor, and wherein
a gate of the first switching transistor receives a charging signal,
a first terminal of the first switching transistor is coupled to the second terminal of the charging current source transistor, and
a second terminal of the first switching transistor is coupled to the load.

3. The charge pump according to claim 2, wherein the first switching transistor uses a thin gate oxygen transistor.

4. The charge pump according to claim 2, wherein the charging current source transistor uses a thin gate oxygen transistor.

5. The charge pump according to claim 1, wherein the degeneration circuit has a first impedance, the first impedance controls a voltage value of the second voltage to drive the charging current source transistor, the switch circuit, and the discharging current source transistor by using the second voltage.

6. The charge pump according to claim 5, wherein the degeneration circuit comprises at least one resistor.

7. The charge pump according to claim 5, wherein the degeneration circuit comprises at least one transistor.

8. The charge pump according to claim 7, wherein the at least one transistor uses a thick gate oxygen transistor.

9. The charge pump according to claim 8, wherein the charging current source transistor uses a thick gate oxygen transistor, and wherein gates of a plurality of transistors and a gate of the charging current source transistor receive a same control signal.

10. The charge pump according to claim 8, wherein the charging current source transistor uses a thick gate oxygen transistor, and wherein a size of the at least one transistor is the same as that of the charging current source transistor.

11. The charge pump according to claim 7, wherein gates of a plurality of transistors receive a same control signal.

12. The charge pump according to claim 2, wherein the switch circuit comprises a second switching transistor and a bypass current transistor, and wherein
a gate of the second switching transistor receives a reverse signal of the charging signal,
a first terminal of the second switching transistor is coupled to the second terminal of the charging current source transistor,
a second terminal of the second switching transistor is coupled to a gate and a first terminal of the bypass current transistor, and
a second terminal of the bypass current transistor is coupled to the ground.

13. The charge pump according to claim 1, wherein the charge pump comprises a third switching transistor, and wherein
a gate of the third switching transistor receives a discharging signal,
a first terminal of the third switching transistor is coupled to the load, and
a second terminal of the third switching transistor is coupled to the first terminal of the discharging current source transistor.

* * * * *